(12) United States Patent
Xu

(10) Patent No.: US 10,114,245 B2
(45) Date of Patent: Oct. 30, 2018

(54) ARRAY SUBSTRATE HAVING METALLIC ELECTRODES FOR LIGHT REFLECTION AND MANUFACTURING METHOD FOR ARRAY SUBSTRATE HAVING METALLIC ELECTRODES FOR LIGHT REFLECTION

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 160 days.

(21) Appl. No.: 15/101,884

(22) PCT Filed: May 13, 2016

(86) PCT No.: PCT/CN2016/082106
§ 371 (c)(1),
(2) Date: Jun. 3, 2016

(87) PCT Pub. No.: WO2017/128558
PCT Pub. Date: Aug. 3, 2017

(65) Prior Publication Data
US 2018/0046008 A1 Feb. 15, 2018

(30) Foreign Application Priority Data
Jan. 29, 2016 (CN) .......................... 2016 1 0066589

(51) Int. Cl.
G02F 1/1333 (2006.01)
H01L 27/12 (2006.01)
(Continued)

(52) U.S. Cl.
CPC .... *G02F 1/13336* (2013.01); *G02F 1/134309* (2013.01); *G02F 1/136286* (2013.01);
(Continued)

(58) Field of Classification Search
CPC ....... H01L 21/775; H01L 27/12; H01L 27/13; H01L 29/66757; H01L 27/3248
See application file for complete search history.

(56) References Cited

U.S. PATENT DOCUMENTS 7,443,372 B2 * 10/2008 Lee .................. G02F 1/134363
345/209
2006/0273316 A1 * 12/2006 Yang .................. G02F 1/13458
257/59

(Continued)

FOREIGN PATENT DOCUMENTS

| CN | 101609236 A | 12/2009 |
| CN | 102543863 A | 7/2012 |
| CN | 105487285 A | 4/2016 |

*Primary Examiner* — Quoc Hoang
(74) *Attorney, Agent, or Firm* — Andrew C. Cheng

(57) ABSTRACT

An array substrate and a manufacturing method. The array substrate includes a substrate, multiple gate and data lines, and multiple common electrode lines parallel with the gate lines. The substrate includes a first surface. Among two adjacent gate lines and data lines, one pixel region is defined. The array substrate further includes a thin-film transistor, a common electrode, a pixel electrode and a storage capacitor disposed in the pixel region. The transistor includes a gate electrode, the first insulation layer, a channel layer, a source and drain electrode. The storage capacitor includes a first and a second conductive portion. The gate electrode, the common electrode line, the common electrode and the first conductive portion are disposed on the first surface. The channel layer, the source and drain electrode, the second conductive portion and the pixel electrode are disposed on the first insulation layer. The pixel electrode is a metal layer.

6 Claims, 3 Drawing Sheets

(51) Int. Cl.
    *H01L 29/417*    (2006.01)
    *G02F 1/1343*    (2006.01)
    *G02F 1/1362*    (2006.01)
    *H01L 27/32*     (2006.01)
    *G02F 1/136*     (2006.01)
    *H01L 21/77*     (2017.01)
(52) U.S. Cl.
    CPC ...... *H01L 27/1262* (2013.01); *H01L 27/3248* (2013.01); *H01L 29/41733* (2013.01); *G02F 2001/13606* (2013.01); *H01L 2021/775* (2013.01)

(56) References Cited

U.S. PATENT DOCUMENTS

| | | |
|---|---|---|
| 2009/0057671 A1 | 3/2009 | Ryu et al. |
| 2014/0138714 A1 | 5/2014 | Chen et al. |

* cited by examiner

ARRAY SUBSTRATE HAVING METALLIC ELECTRODES FOR LIGHT REFLECTION AND MANUFACTURING METHOD FOR ARRAY SUBSTRATE HAVING METALLIC ELECTRODES FOR LIGHT REFLECTION

CROSS REFERENCE

The claims of this application have submitted to the State Intellectual Property Office of the People's Republic of China (SIPO) on Jan. 29, 2016, Application No. 201610066589.4. The priority right based on the China application has a title of "Array substrate and manufacturing method for array substrate". The entire contents of the above-mentioned patent application will be incorporated in the present application through citing.

BACKGROUND OF THE INVENTION

1. Field of the Invention

The present invention relates to a display technology field, and more particularly to an array substrate and a manufacturing method for the array substrate.

2. Description of Related Art

A display device such as Liquid Crystal Display (LCD) is a common electric device. Because having features of a low power consumption, small size, light weight and so on, the display device is favored by users. A trans-flective liquid crystal display has transmissive and reflective properties at the same time. One pixel region of the trans-flective liquid crystal display panel includes a transmissive area having a transparent electrode and a reflective area having a reflection layer. In a dark place, adopting the transmissive area of the pixel region and a backlight source to display an image. In a bright place, adopting the reflective area of the pixel region and an external light to display an image. Therefore, the trans-flective liquid crystal display can be adapted to different dark and bright environment in order to obtain a wide application. In the conventional art, the ability of reflecting an external light in the trans-flective liquid crystal display is weak so that the display quality of displaying an image is poor when the trans-flective liquid crystal display reflects an external light.

SUMMARY OF THE INVENTION

The present invention provides an array substrate, comprising: a substrate, multiple gate lines and multiple data lines which are disposed at a same side of the substrate; wherein, the substrate includes a first surface; the multiple gate lines are disposed on the first surface; the multiple gate lines are extended along a first direction and separately arranged along a second direction; the multiple data lines and the multiple gate lines are insulated by a first insulation layer; the multiple data lines are extended along the second direction and separately arranged along the first direction; the array substrate further includes multiple common electrode lines; the common electrode lines and the multiple gate lines are parallel; one common electrode line is disposed between two adjacent gate lines, and the common electrode lines and the data lines are insulated by the first insulation layer; among two adjacent gate lines and two adjacent data lines, one pixel region is defined; the array substrate further includes a thin-film transistor, a common electrode, a pixel electrode and a storage capacitor disposed in the pixel region; the thin-film transistor includes a gate electrode, the first insulation layer, a channel layer, a source electrode and a drain electrode; the gate electrode is disposed on the first surface; the common electrode and the common electrode line are electrically connected, and the common electrode and the common electrode line are disposed on the first surface; the storage capacitor includes a first conductive portion and a second conductive portion; the first conductive portion is disposed on the first surface; the first insulation layer is disposed on the first conductive portion; the second conductive portion is disposed on the first insulation layer, and corresponding to the first conductive portion; the channel layer, the source electrode and the drain electrode are disposed on the first insulation layer, and the source electrode and the drain electrode 850 are disposed at two opposite terminals of the channel layer; the pixel electrode is disposed on the first insulation layer, and the pixel electrode is a metal layer for reflecting a light incident to the pixel electrode; a second insulation layer covers the channel layer, the source electrode, the drain electrode, the pixel electrode, the second conductive portion and the data line.

Wherein, each of the common electrode line and the common electrode is a metal layer, respectively used for reflecting a light incident to the common electrode line and the common electrode.

Wherein, each of the first conductive portion and the second conductive portion is a metal layer.

Wherein, the thin-film transistor further includes a first ohmic contact layer; the first ohmic contact layer is disposed between the channel layer and the source electrode for decreasing a contact resistance between the channel layer and the source electrode.

Wherein, the thin-film transistor further includes a second ohmic contact layer; the second ohmic contact layer is disposed between the channel layer and the drain electrode for decreasing a contact resistance between the channel layer and the drain electrode.

Wherein, the first insulation layer includes a first through hole provided corresponding to the gate line; the second insulation layer includes a second through hole provided corresponding to the first through hole, and also includes a third through hole provided corresponding to the data line; a gate terminal is electrically connected to the gate line through the first through hole and the second through hole; a data terminal is electrically connected to the data line through the third through hole; wherein, the gate terminal and the data terminal are electrically conductive.

The present invention also provides a manufacturing method for an array substrate, comprising: providing a substrate; depositing an integral layer of a first metal layer on a first surface of the substrate; patterning the first metal layer in order to form multiple gate lines extended along a first direction and separately arranged along a second direction, multiple gate electrodes disposed separately and each gate electrode disposed between two of the multiple gate lines, a first conductive portion, common electrode lines corresponding to and parallel with the gate electrode lines, and common electrode connected with the common electrode line and extended away from the gate electrode line; forming a first insulation layer covering the gate electrode, the first insulation portion, the gate line, the common electrode line, and the common electrode; on a surface of the first insulation layer away from the substrate, forming a channel layer disposed corresponding to the gate electrode; forming a second metal layer covering the first insulation layer and the channel layer; patterning the second metal layer in order to form multiple data lines extended along the second direction and arranged along the first direction, a source electrode and a drain electrode which are disposed between two adjacent data lines and corresponding to two terminals of the channel layer, a pixel electrode separated from the drain electrode, and a second conductive portion corresponding to the first conductive portion; and forming a second insulation layer covering the channel layer, the source electrode, the drain electrode, the pixel electrode, the second conductive portion and the data line.

Wherein, the step of on a surface of the first insulation layer away from the substrate, forming a channel layer disposed corresponding to the gate electrode comprises: on the surface of the first insulation layer away from the substrate, forming an integral layer of an amorphous silicon layer; patterning the amorphous silicon layer to keep the amorphous silicon layer which is corresponding to the gate electrode; and performing an ion doping to two terminal of the kept amorphous silicon layer in order to respectively form the first ohmic contact layer and the second ohmic contact layer; the amorphous silicon layer which is not performed the ion doping is the channel layer.

Wherein, the manufacturing method for the array substrate further includes following steps: providing a first through hole corresponding to the gate line on the first insulation layer, providing a second through hole corresponding to the first through hole, and a third through hole corresponding to the data line on the second insulation layer; forming a conductive material layer on the second insulation layer; and patterning the conductive material layer to keep the conductive material layer which is corresponding to the second through hole and the first through hole, and to keep the conductive material layer which is corresponding to the third through hole; wherein, the conductive material layer which is corresponding to the second through hole and the first through hole is a gate terminal, and the conductive material layer which is corresponding to the third through hole is a data terminal.

Wherein, the ion doping is an N-type ion doping.

Comparing to the conventional art, in the manufacturing method for the array substrate in the present invention, the pixel electrode, the source electrode and the drain electrode in the thin-film transistor are manufactured in a same process so as to save the process. Besides, the pixel electrode is a metal layer, which can reflect a light incident to the pixel electrode. Therefore, when the liquid crystal display device applying the array substrate is placed in a bright place, using the light reflected by the pixel electrode to display an image in order to improve a display quality when the liquid crystal display device displays an image.

Furthermore, the common electrode line, the common electrode and the gate electrode are manufactured in a same process so as to save the process. Besides, the common electrode line and the common electrode are metal layers for respectively reflecting a light incident to the common electrode line and the common electrode. Therefore, when the liquid crystal display device applying the array substrate is placed in a bright place, using the light reflected by the pixel electrode to display an image in order to improve a display quality when the liquid crystal display device displays an image.

Furthermore, the first conductive portion of the storage capacitor and the gate electrode are manufactured in a same process in order to save the process. The second conductive portion of the storage capacitor, the source electrode and the drain electrode are manufactured in a same process in order to save the process.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
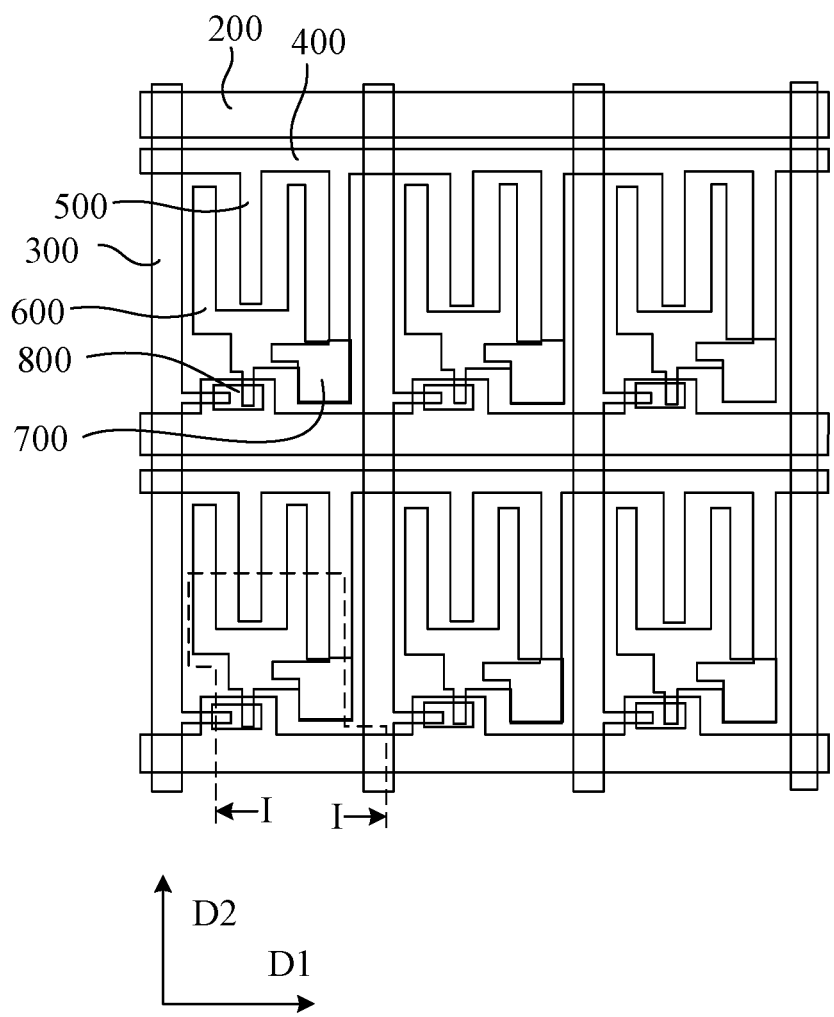
FIG. 1 is a top view of an array substrate of a preferred embodiment of the present invention.
Figure 2:
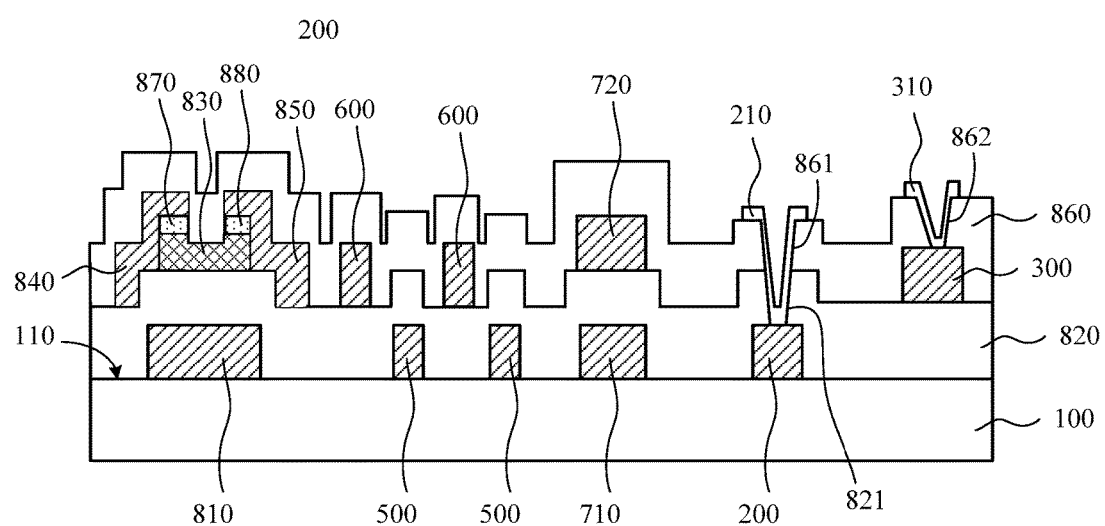
FIG. 2 is a cross-sectional view along I-I line shown in FIG. 1.

With reference to FIG. 1 and FIG. 2, and FIG. 1 is a top view of an array substrate of a preferred embodiment of the present invention, and FIG. 2 is a cross-sectional view along I-I line shown in FIG. 1. The array substrate 10 can be applied in an In-Plane Switching (IPS) panel device. The array substrate 10 includes a substrate 100, and multiple gate lines 200 and multiple data lines 300 which are disposed at a same side of the substrate 100. The substrate 100 includes a first surface 110. The multiple gate lines 200 are disposed on the first surface 110, and the multiple gate lines 200 are extended along a first direction D1 and separately arranged along a second direction D2.

The multiple data lines 300 and the multiple gate lines 200 are insulated by a first insulation layer 820. The data lines 300 are extended along the second direction D2 and separately arranged along the first direction D1. The array substrate 10 further includes multiple common electrode line 400. The common electrode lines 400 and the multiple gate lines 200 are parallel. One common electrode line 400 is disposed between two adjacent gate lines 200, and the common electrode line 400 and the data line 300 are insulated by the first insulation layer 820.

Among two adjacent gate lines 200 and two adjacent data lines 300, one pixel region is defined. The array substrate 10 further includes a thin-film transistor 800, a common electrode 500, a pixel electrode 600 and a storage capacitor 700 disposed in the pixel region. The thin-film transistor 800 includes a gate electrode 810, the first insulation layer 820, a channel layer 830, a source electrode 840 and a drain electrode 850. The gate electrode 810 is disposed on the first surface 110. The common electrode 500 and the common electrode line 400 are electrically connected, and the common electrode 500 and the common electrode line 400 are disposed on the first surface 110.

The storage capacitor 700 includes a first conductive portion 710 and a second conductive portion 720. The first conductive portion 710 is disposed on the first surface 110. The first insulation layer 820 is disposed on the first conductive portion 710. The second conductive portion 720 is disposed on the first insulation layer 820, and corresponding to the first conductive portion 710. The channel layer 830, the source electrode 840 and the drain electrode 850 are disposed on the first insulation layer 820, and the source electrode 840 and the drain electrode 850 are disposed at two opposite terminals of the channel layer 830.

The pixel electrode 600 is disposed on the first insulation layer 820, and the pixel electrode 600 is a metal layer for reflecting a light incident to the pixel electrode 600. A second insulation layer 860 covers the channel layer 830, the source electrode 840, the drain electrode 850, the pixel electrode 600, the second conductive portion 720 and the data line 300. Wherein, the first direction D1 can be an X-axis direction, and the second direction D2 can be a Y-axis direction.

The substrate 100 can be but not limited to an insulation substrate such as a glass substrate or a plastic substrate.

In the present embodiment, each of the common electrode line 400 and the common electrode 500 is a metal layer, respectively used for reflecting a light incident to the common electrode line 400 and the common electrode 500.

In the present embodiment, each of the first conductive portion 710 and the second conductive portion 720 is a metal layer.

In the present embodiment, the thin-film transistor 800 further includes a first ohmic contact layer 870, the first ohmic contact layer 870 is disposed between the channel layer 830 and the source electrode 840 for decreasing a contact resistance between the channel layer 830 and the source electrode 840.

The thin-film transistor 800 further includes a second ohmic contact layer 880. The second ohmic contact layer 880 is disposed between the channel layer 830 and the drain electrode 850 for decreasing a contact resistance between the channel layer 830 and the drain electrode 850.

The first insulation layer 820 includes a first through hole 821 provided corresponding to the gate line 200. The second insulation layer 860 includes a second through hole 861 provided corresponding to the first through hole 821, and also includes a third through hole 862 provided corresponding to the data line 300. A gate terminal 210 is electrically connected to the gate line 200 through the first through hole 821 and the second through hole 861. A data terminal 310 is electrically connected to the data line 300 through the third through hole 862. Wherein, the gate terminal 210 and the data terminal 310 are electrically conductive. The gate terminal 210 and the data terminal 310 can electrically connect to an integrated chip in order to receive signals of the integrated chip.

Comparing to the conventional art, the pixel electrode 600 in the array substrate 10 of the present invention is a metal layer for reflecting a light incident to the pixel electrode 600. When the liquid crystal display device applying the array substrate 10 is placed in a bright place, using the light reflected by the pixel electrode 600 to display an image in order to improve a display quality when the liquid crystal display device displays an image.

Furthermore, each of the common electrode line 400 and the common electrode 500 is a metal layer, respectively used for reflecting a light incident to the common electrode line 400 and the common electrode 500. Therefore, when the liquid crystal display device applying the array substrate 10 is placed in a bright place, using the light reflected by the pixel electrode 600 to display an image in order to improve a display quality when the liquid crystal display device displays an image.

Figure 3:
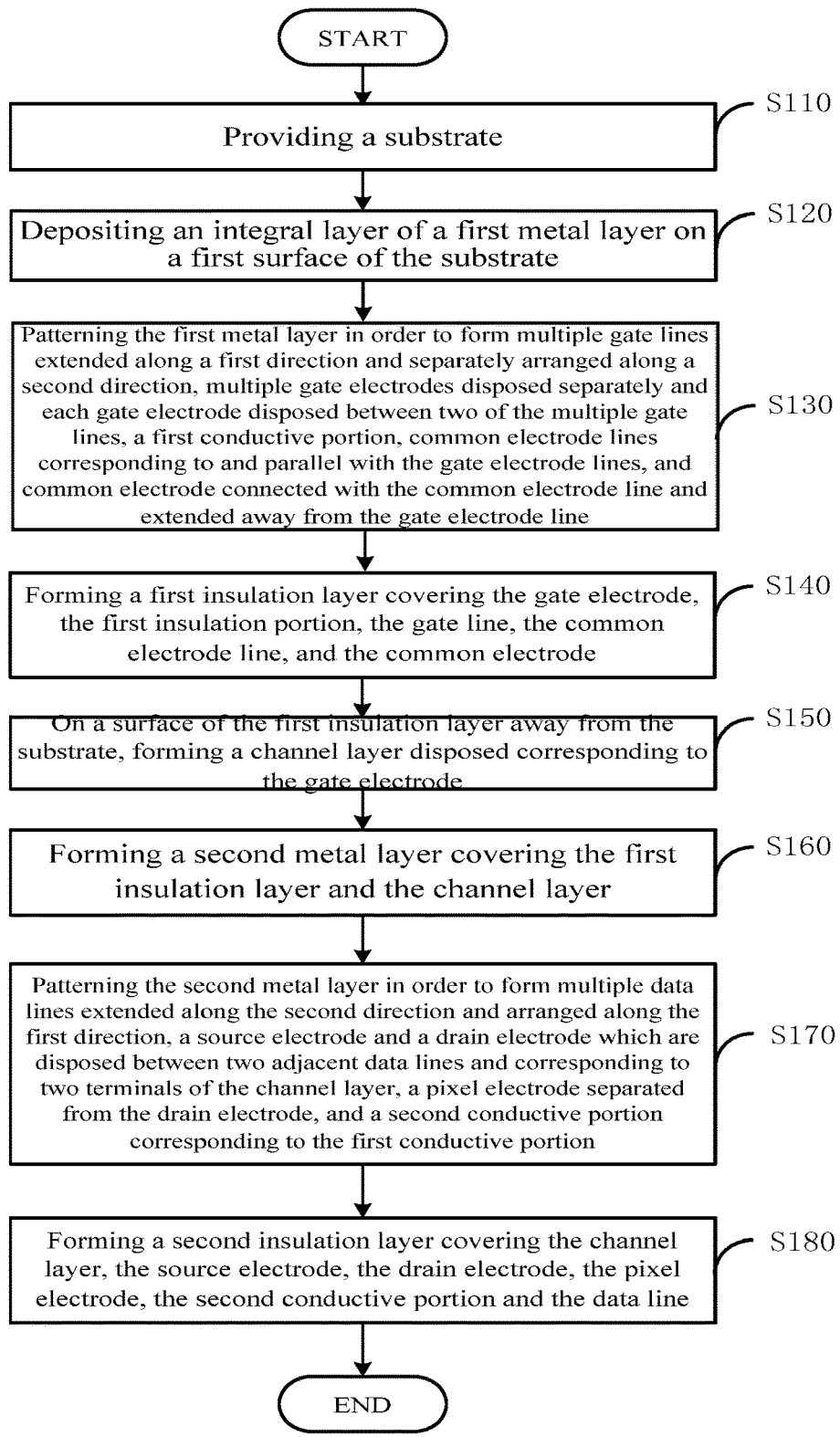
FIG. 3 is a flow chart of a manufacturing method for an array substrate of a preferred embodiment of the present invention.

The following combine FIG. 1, FIG. 2 and the description for the array substrate 10 described previously to introduce the manufacturing method for the array substrate of the present invention. With further reference to FIG. 3, and FIG. 3 is a flow chart of a manufacturing method for an array substrate of a preferred embodiment of the present invention. The manufacturing method of the array substrate can include but not limited to following steps.

Step S110, providing a substrate 110. The substrate 100 can be but not limited to an insulation substrate such as a glass substrate or a plastic substrate.

Step S120, depositing an integral layer of a first metal layer on a first surface 111 of the substrate 110. The first metal layer includes but not limited to any one or more of aluminum (Al), molybdenum (Mo), copper (Cu). The first metal layer can be formed through a physical vapor deposition (PVD), and a thickness of first metal layer can be in a range of 3000 Å~6000 Å.

Step S130, patterning the first metal layer in order to form multiple gate lines 200 extended along a first direction D1 and separately arranged along a second direction D2, multiple gate electrodes 810 disposed separately and each gate electrode 810 disposed between two of the multiple gate lines 200, a first conductive portion 710, common electrode lines 400 corresponding to and parallel with the gate electrode lines 200, and common electrode 500 connected with the common electrode line 400 and extended away from the gate electrode line 200. The patterning of the first metal layer can be performed through exposure, development, etching and peeling through a mask.

Step S140, forming a first insulation layer 820 covering the gate electrode 810, the first insulation portion 710, the gate line 200, the common electrode line 400, and the common electrode 500. The first insulation layer 820 can be formed through Plasma Enhanced Chemical Vapor Deposition (PECVD) to deposit a layer having a thickness in a range of 3000 Å~6000 Å. A material of the insulation layer can be but not limited to SiNx.

Step S150, on a surface of the first insulation layer 820 away from the substrate 110, forming a channel layer 830 disposed corresponding to the gate electrode 810. Specifically, the step S150 includes following steps.

Step S151, on the surface of the first insulation layer 820 away from the substrate 110, forming an integral layer of an amorphous silicon layer. The amorphous silicon layer can be formed through a plasma enhanced chemical vapor deposition method in order to form an amorphous silicon material having a thickness in a range of 1500 Å~3000 Å.

Step S152, patterning the amorphous silicon layer to keep the amorphous silicon layer which is corresponding to the gate electrode 810.

Step S153, performing an ion doping to two terminal of the kept amorphous silicon layer in order to respectively form the first ohmic contact layer 870 and the second ohmic contact layer 880. The amorphous silicon layer which is not performed the ion doping is the channel layer 830. In one embodiment, the ion doping is an N-type ion doping.

Step S160, forming a second metal layer covering the first insulation layer 820 and the channel layer 830. The second metal layer can include but not limited to any one or more of Al, Mo and Cu. The second metal layer can be formed through a PVD method. A thickness of the second metal layer can be in a range of 3000 Å~6000 Å.

Step S170, patterning the second metal layer in order to form multiple data lines 300 extended along the second direction D2 and arranged along the first direction D1, a source electrode 840 and a drain electrode 850 which are disposed between two adjacent data lines 300 and corresponding to two terminals of the channel layer 830, a pixel electrode 600 separated from the drain electrode 850, and a second conductive portion 720 corresponding to the first conductive portion 710. The patterning of the second metal layer can be performed through exposure, development, etching and peeling through a mask.

Step S180, forming a second insulation layer 860 covering the channel layer 830, the source electrode 840, the drain electrode 850, the pixel electrode 600, the second conductive portion 720 and the data line 300. The second insulation layer 860 can be formed through PECVD to deposit an insulation material having a layer thickness in a range of 2000 Å~56000 Å, and the insulation material can be but not limited to SiNx.

In the present embodiment, the manufacturing method for the array substrate further includes following steps.

Step I, providing a first through hole 821 corresponding to the gate line 200 on the first insulation layer 820, providing a second through hole 861 corresponding to the first through hole 821, and a third through hole 862 corresponding to the data line 300 on the second insulation layer 860.

Step II, forming a conductive material layer on the second insulation layer 860. The conductive material layer is a transparent conductive material layer. The conductive material layer can be but not limited to Indium Tin Oxide (ITO). A thickness of the transparent conductive material layer is in a range of 400 Å~1000 Å.

Step III, patterning the conductive material layer to keep the conductive material layer which is corresponding to the second through hole 861 and the first through hole 821, and to keep the conductive material layer which is corresponding to the third through hole 862. Wherein, the conductive material layer which is corresponding to the second through hole 861 and the first through hole 821 is a gate terminal 210, and the conductive material layer which is corresponding to the third through hole 862 is a data terminal 310.

Comparing to the conventional art, in the manufacturing method for the array substrate in the present invention, the pixel electrode 600, the source electrode 840 and the drain electrode 850 in the thin-film transistor 800 are manufactured in a same process so as to save the process. Besides, the pixel electrode 600 is a metal layer, which can reflect a light incident to the pixel electrode 600. Therefore, when the liquid crystal display device applying the array substrate is placed in a bright place, using the light reflected by the pixel electrode 600 to display an image in order to improve a display quality when the liquid crystal display device displays an image.

Furthermore, the common electrode line 400, the common electrode 500 and the gate electrode 810 are manufactured in a same process so as to save the process. Besides, the common electrode line 400 and the common electrode are metal layers for respectively reflecting a light incident to the common electrode line 400 and the common electrode 500. Therefore, when the liquid crystal display device applying the array substrate 10 is placed in a bright place, using the light reflected by the pixel electrode 600 to display an image in order to improve a display quality when the liquid crystal display device displays an image.

Furthermore, the first conductive portion 710 of the storage capacitor 700 and the gate electrode 810 are manufactured in a same process in order to save the process. The second conductive portion 720 of the storage capacitor 700, the source electrode 840 and the drain electrode 850 are manufactured in a same process in order to save the process.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. An array substrate, comprising:
   a substrate,
   multiple gate lines and multiple data lines which are disposed at a same side of the substrate;
   wherein, the substrate includes a first surface; the multiple gate lines are disposed on the first surface; the multiple gate lines are extended along a first direction and separately arranged along a second direction; the multiple data lines and the multiple gate lines are insulated by a first insulation layer; the multiple data lines are extended along the second direction and separately arranged along the first direction;
   the array substrate further includes multiple common electrode lines; the common electrode lines and the multiple gate lines are parallel; one common electrode line is disposed between two adjacent gate lines, and the common electrode lines and the data lines are insulated by the first insulation layer;
   among two adjacent gate lines and two adjacent data lines, one pixel region is defined; the array substrate further includes a thin-film transistor, a common electrode, pixel electrodes and a storage capacitor disposed in the pixel region; the thin-film transistor includes a gate electrode, the first insulation layer, a channel layer, a source electrode and a drain electrode; the gate electrode is disposed on the first surface; the common electrode and the common electrode line are electrically connected, and the common electrode and the common electrode line are disposed on the first surface;
   the storage capacitor includes a first conductive portion and a second conductive portion; the first conductive portion is disposed on the first surface; the first insulation layer is disposed on the first conductive portion; the second conductive portion is disposed on the first insulation layer, and corresponding to the first conductive portion; the channel layer, the source electrode and the drain electrode are disposed on the first insulation layer, and the source electrode and the drain electrode are disposed at two opposite terminals of the channel layer;
   the pixel electrodes are disposed in the first insulating layer, and the pixel electrodes are metal layers for reflecting light incident to the pixel electrode; a second insulation layer covers the channel layer, the source electrode, the drain electrodes, the pixel electrode, the second conductive portion and the data line;
   wherein the common electrode line and the common electrodes are disposed on the first surface of the substrate so that the common electrodes and the gate electrode are located on the same plane defined by the first surface of the substrate, while the pixel electrodes are located on a plane that is separated from the first surface of the substrate and thus separated from the plane on which the common electrodes and the gate electrode are located.

2. The array substrate according to claim 1, wherein, each of the common electrode line and the common electrode is a metal layer, respectively used for reflecting a light incident to the common electrode line and the common electrode.

3. The array substrate according to claim 1, wherein, each of the first conductive portion and the second conductive portion is a metal layer.

4. The array substrate according to claim 1, wherein, the thin-film transistor further includes a first ohmic contact layer; the first ohmic contact layer is disposed between the channel layer and the source electrode for decreasing a contact resistance between the channel layer and the source electrode.

5. The array substrate according to claim 1, wherein, the thin-film transistor further includes a second ohmic contact layer; the second ohmic contact layer is disposed between the channel layer and the drain electrode for decreasing a contact resistance between the channel layer and the drain electrode.

6. The array substrate according to claim 1, wherein, the first insulation layer includes a first through hole provided corresponding to the gate line; the second insulation layer includes a second through hole provided corresponding to the first through hole, and also includes a third through hole provided corresponding to the data line; a gate terminal is electrically connected to the gate line through the first through hole and the second through hole; a data terminal is electrically connected to the data line through the third through hole; wherein, the gate terminal and the data terminal are electrically conductive.

\* \* \* \* \*